US008988880B2

(12) United States Patent
Vincent

(10) Patent No.: US 8,988,880 B2
(45) Date of Patent: Mar. 24, 2015

(54) HEAT TRANSFER ASSEMBLY WITH HEAT PIPE BRACE AND METHOD FOR ASSEMBLING A HEAT TRANSFER ASSEMBLY

(71) Applicant: General Electric Company, Shelton, CT (US)

(72) Inventor: Laith Anthony Vincent, Charlottesville, VA (US)

(73) Assignee: GE Intelligent Platforms, Inc., Charlottesville, VA (US)

( * ) Notice: Subject to any disclaimer, the term of this patent is extended or adjusted under 35 U.S.C. 154(b) by 123 days.

(21) Appl. No.: 13/622,842

(22) Filed: Sep. 19, 2012

(65) Prior Publication Data

US 2014/0078673 A1    Mar. 20, 2014

(51) Int. Cl.
  *H05K 7/20*    (2006.01)
(52) U.S. Cl.
  USPC ............... 361/700; 361/679.47; 361/679.52; 361/704; 361/714; 165/104.26; 165/104.33
(58) Field of Classification Search
  CPC ... H05K 7/20; H05K 7/2049; H05K 7/20418; H05K 7/20809; H01L 23/40; H01L 23/367; H01L 23/427; F28D 1/00; F28D 15/04; F28D 7/00
  USPC ....................... 361/679.46–679.55, 688, 689, 361/700–727; 165/80.2, 80.3, 80.4, 80.5, 165/104.21, 104.22, 104.26, 104.33, 165/104.34, 185; 174/50, 50.52, 15.1, 15.2, 174/15.3, 16.3; 257/714–726
  See application file for complete search history.

(56) References Cited

U.S. PATENT DOCUMENTS

| 5,930,115 | A | 7/1999 | Tracy et al. |
| 5,973,920 | A | 10/1999 | Altic et al. |
| 6,111,750 | A * | 8/2000 | Gates ............................ 361/700 |
| 6,209,631 | B1 * | 4/2001 | Garcia-Ortiz ................. 165/287 |
| 6,570,761 | B2 | 5/2003 | Stone et al. |
| 6,769,487 | B2 | 8/2004 | Hache |
| 7,177,154 | B2 * | 2/2007 | Lee ............................... 361/704 |
| 7,277,286 | B2 * | 10/2007 | Lee ............................... 361/700 |
| 7,391,613 | B2 | 6/2008 | Lai et al. |
| 7,845,395 | B2 * | 12/2010 | Chu ......................... 165/104.33 |
| 8,031,464 | B2 * | 10/2011 | Adkins et al. ............ 361/679.47 |
| 8,223,494 | B2 | 7/2012 | Bult |
| 8,422,231 | B2 * | 4/2013 | Huang et al. .................. 361/709 |
| 2002/0053421 | A1 | 5/2002 | Hisano et al. |
| 2004/0228093 | A1 | 11/2004 | Lee |

(Continued)

FOREIGN PATENT DOCUMENTS

| DE | 202004003785 U1 | 7/2004 |
| JP | 2000124652 A * | 4/2000 ............ G06K 17/00 |

OTHER PUBLICATIONS

Search Report from PCT/US2013/055366 dated Dec. 5, 2013.

*Primary Examiner* — Michail V Datskovskiy
(74) *Attorney, Agent, or Firm* — GE Global Patent Operation; Mark A. Conklin

(57) ABSTRACT

An electronics device and method for assembling a heat transfer assembly of the same. An electronics device includes a circuit board, a chassis that houses the circuit board, a heat pipe configured to transfer heat from the circuit board to a wall of the chassis, and a brace configured to press the heat pipe against the wall. A brace includes a medial portion configured to contact a heat pipe and an end portion including a protrusion that is configured to be received in a depression of a chassis.

18 Claims, 7 Drawing Sheets

(56) References Cited

U.S. PATENT DOCUMENTS

2007/0263355 A1* 11/2007 Yu et al. .................. 361/700
2008/0159852 A1 7/2008 Stephenson et al.
2009/0009969 A1 1/2009 Chu
2011/0100606 A1* 5/2011 Li et al. .................... 165/104.26
2011/0304980 A1 12/2011 Adkins et al.
2012/0118536 A1 5/2012 Huang

* cited by examiner

HEAT TRANSFER ASSEMBLY WITH HEAT PIPE BRACE AND METHOD FOR ASSEMBLING A HEAT TRANSFER ASSEMBLY

TECHNICAL FIELD

The technical field relates generally to systems and methods for cooling electronics.

BACKGROUND

An electronics device conventionally includes enclosed electronic components. When the electronic components operate, heat is produced and accumulates. The resulting high temperature can adversely affect the performance and life of the electronic components. This is particularly true for applications where the space inside the electronics device is relatively small.

Electronic cooling systems have been developed to transfer heat away from electronic components and dissipate heat. Some such systems include a heat pipe or a heat sink. For example, a heat pipe transfers heat to a wall that is exposed to free moving air to wick away heat. To be effective, the heat pipe needs to be in good contact with the wall. If the heat pipe can move out of contact with the wall or if only a fraction of the intended surface area of the heat pipe is touching the wall, heat will not transfer to the wall and will become trapped in the device. As a result, the electronic components can overheat.

One attempt at keeping the heat pipe in contact with a wall has been to embed the heat pipe in the wall. However, embedding a heat pipe in a wall is difficult and expensive. More often, a heat pipe is attached to a board using a bracket. However, since the heat pipe is attached to the board and not the wall, the heat pipe can move out of contact with the wall. The heat pipe can also be attached to a wall using a bracket. This arrangement presents a number of problems since holes are formed in the wall to receive screws to attach the bracket. The problems include: loss of aesthetics from having screws projecting through holes in the wall, reduced heat transfer due to holes in the wall, and increased difficulty in assembling the electronics device. In addition, the bracket does not electrically isolate the heat pipe. Therefore, a heretofore unaddressed need exists to address the aforementioned deficiencies and inadequacies.

SUMMARY

The various embodiments of the present disclosure overcome many of the shortcomings of the prior art. The present disclosure provides a heat pipe assembly including a brace that is configured to press a heat pipe against a wall of a chassis. The brace keeps the heat pipe in place and maximizes the surface area contact between the heat pipe and the wall for optimal heat transfer. One of the benefits and advantages of the heat pipe assembly of the present disclosure is that it is configured to transfer heat from the heat pipe to the inner wall without the need for holes in the wall.

According to an exemplary embodiment, an electronics device includes a circuit board, a chassis that houses the circuit board, a heat pipe that is configured to transfer heat from the circuit board to a wall of the chassis, and a brace that is configured to press the heat pipe against the wall.

According to an exemplary embodiment, a brace that is configured to press a heat pipe against a wall of a chassis includes a medial portion and at least one end portion. The medial portion is configured to contact a heat pipe. The at least one end portion includes a protrusion that is configured to be received in a depression of a chassis.

The foregoing has broadly outlined some of the aspects and features of the various embodiments, which should be construed to be merely illustrative of various potential applications of the disclosure. Other beneficial results can be obtained by applying the disclosed information in a different manner or by combining various aspects of the disclosed embodiments. Accordingly, other aspects and a more comprehensive understanding may be obtained by referring to the detailed description of the exemplary embodiments taken in conjunction with the accompanying drawings, in addition to the scope defined by the claims.

DETAILED DESCRIPTION

As required, detailed embodiments are disclosed herein. It must be understood that the disclosed embodiments are merely exemplary of various and alternative forms. As used herein, the word "exemplary" is used expansively to refer to embodiments that serve as illustrations, specimens, models, or patterns. The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

Exemplary embodiments are described in the context of an electronics device such as an industrial controller. However, the teachings provided herein are applicable to other electronics enclosures, and the exemplary teachings are not meant to limit the applicability to industrial controllers alone. For example, the teachings described herein are applicable in other contexts including computers, communications devices, and the like.

Figure 1:
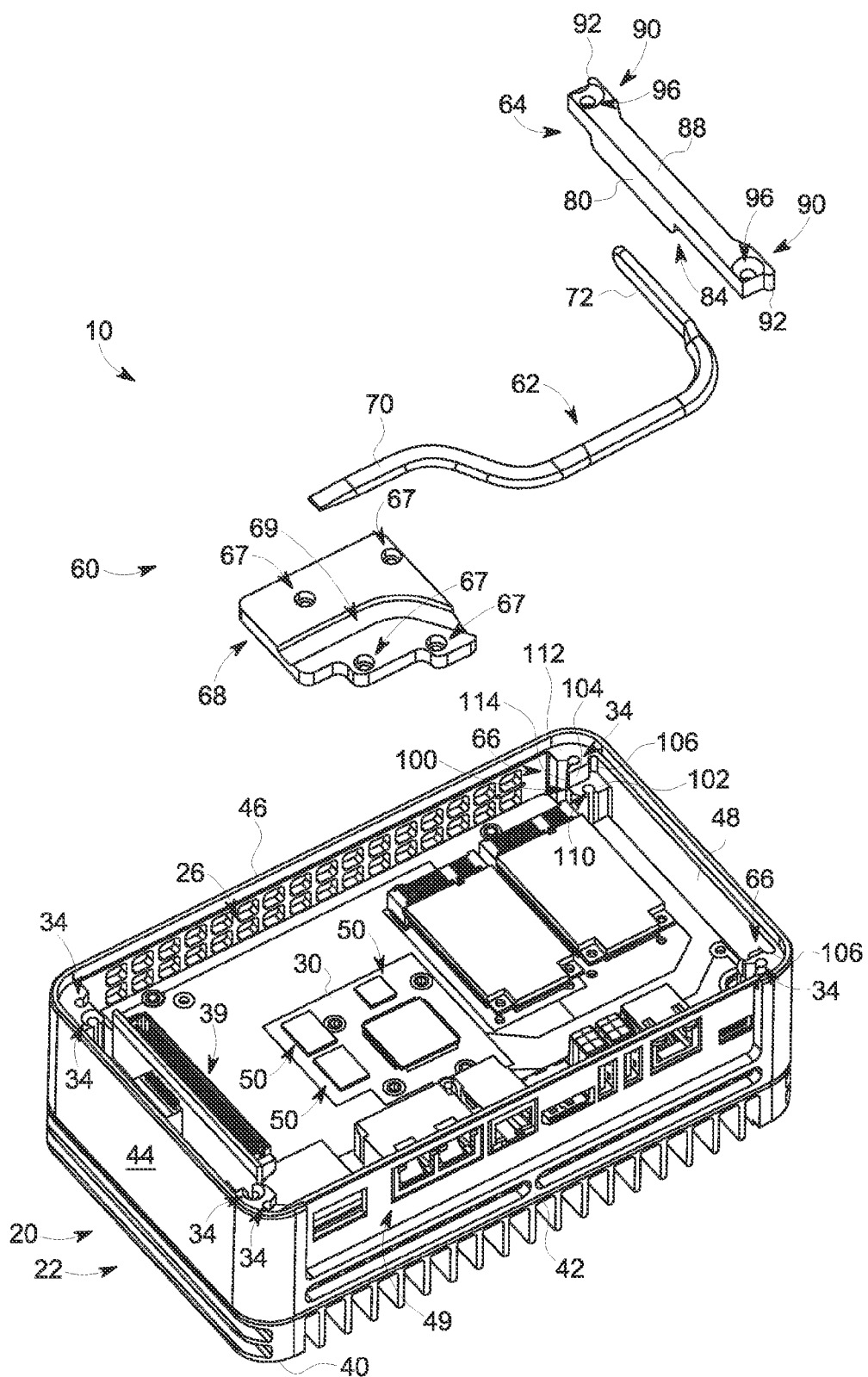
FIG. 1 is an exploded perspective view of an electronics device according to an exemplary embodiment of the disclosure, the electronics device is illustrated without a lid to show a heat transfer assembly.
Figure 2:
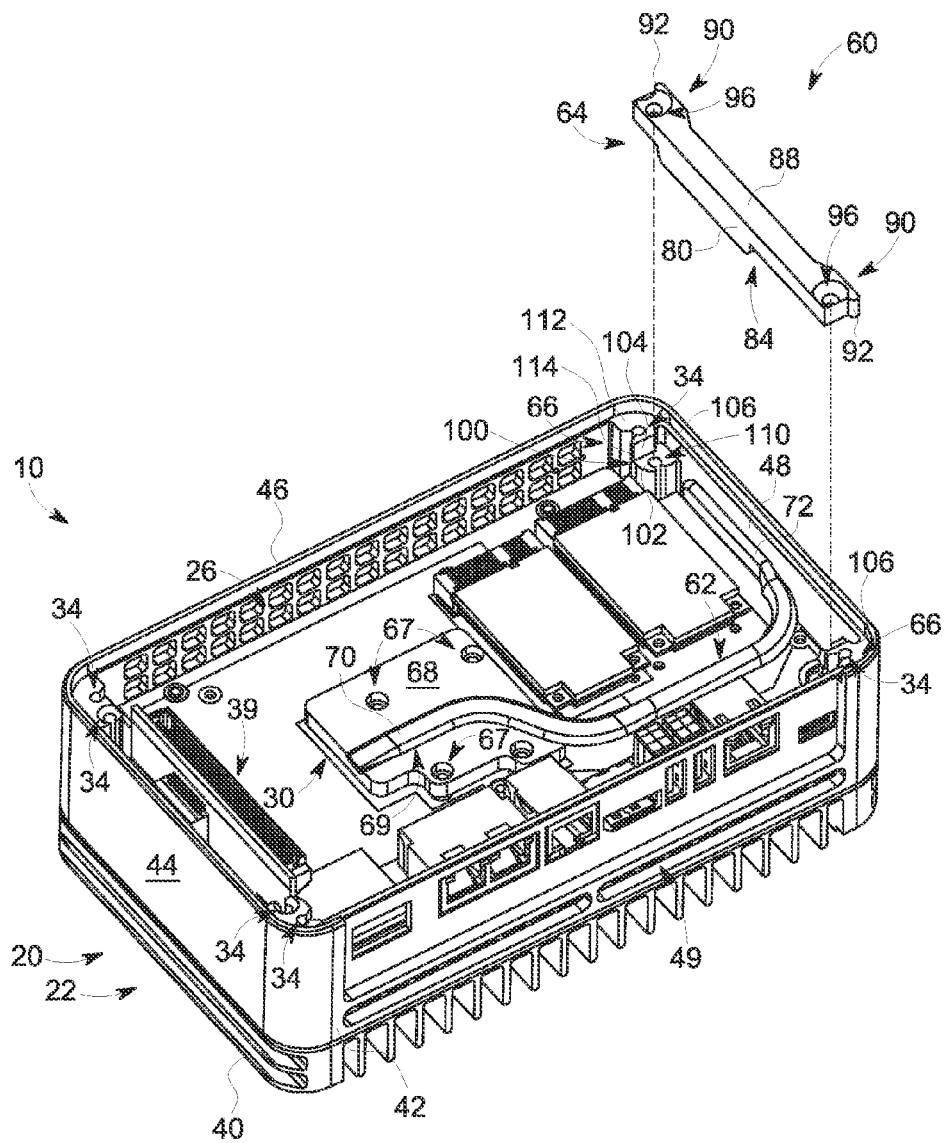
FIG. 2 is an exploded perspective view of the electronics device of FIG. 1, the electronics device is illustrated without a lid to show a brace of the heat transfer assembly.
Figure 3:
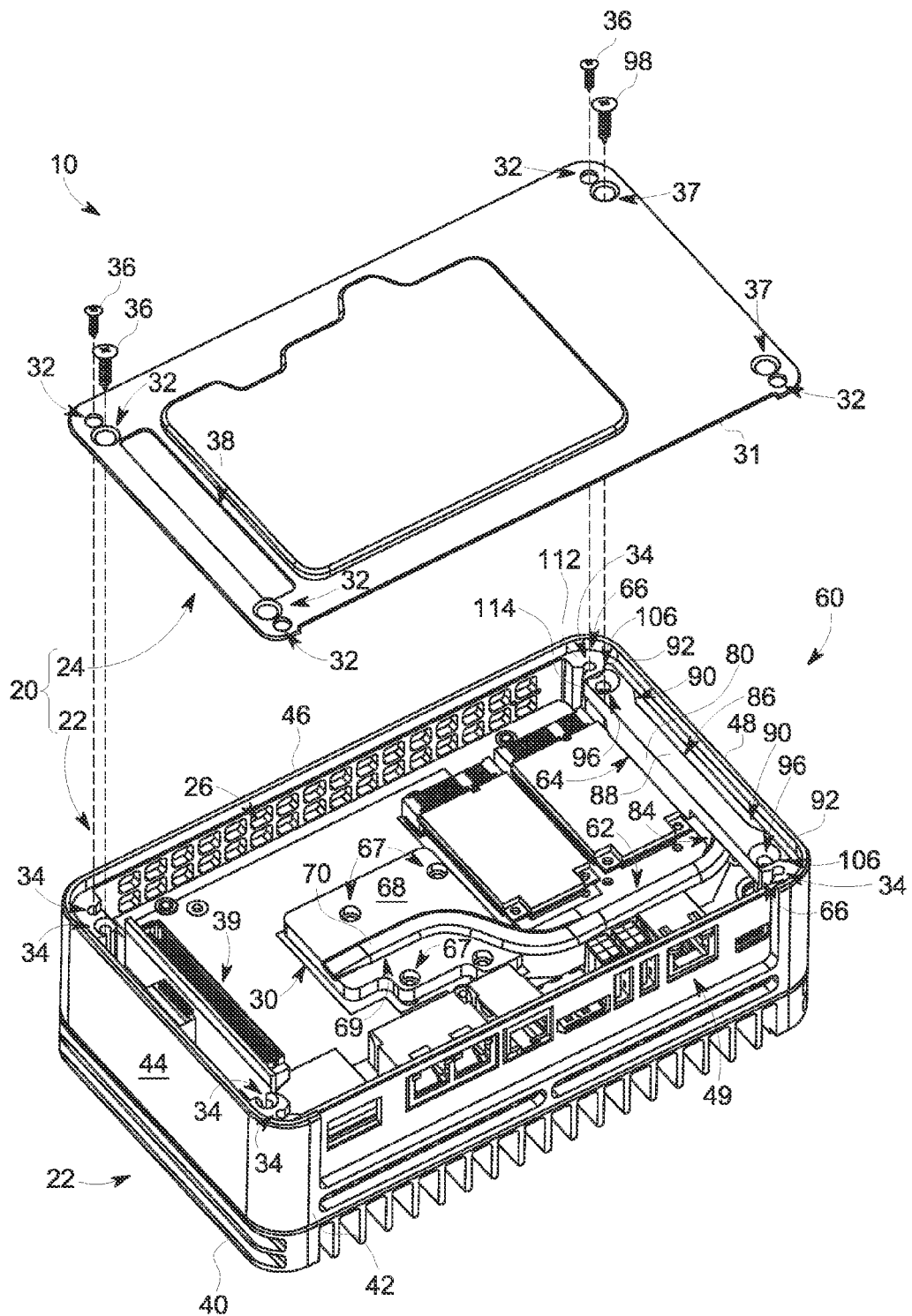
FIG. 3 is an exploded perspective view of the electronics device of FIG. 1, the electronics device is illustrated with a lid.
Figure 4:
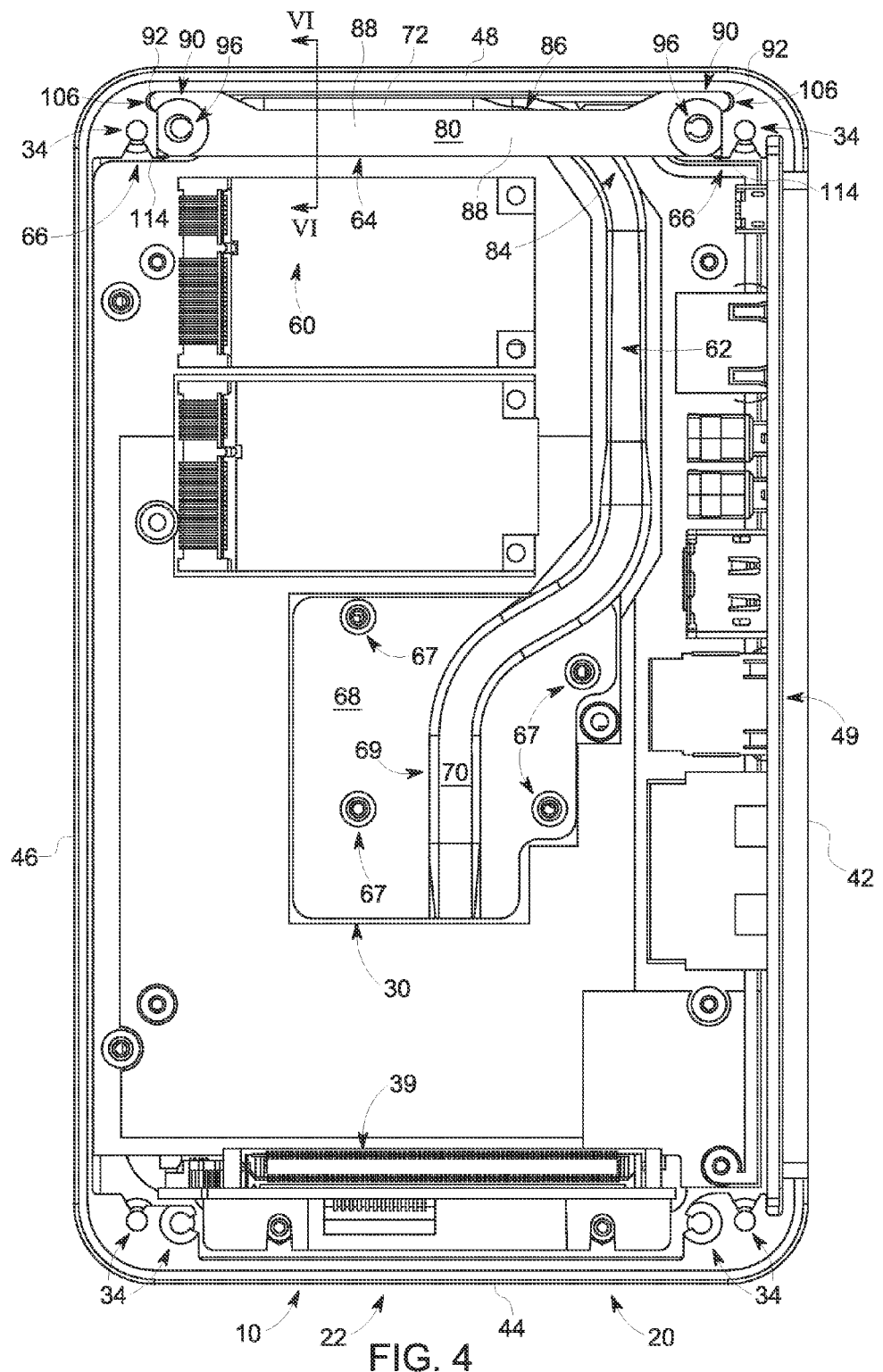
FIG. 4 is a plan view of the electronics device of FIG. 1.

Referring to FIGS. 1-3, an exemplary electronics device 10 includes a chassis 20. Generally, the chassis 20 is a frame on which circuit boards and other electronics are mounted as well as the case that houses and protects the circuit boards and other electronics from dust, moisture, and damage.

Referring to FIG. 3, the chassis 20 includes a body 22 and a lid 24 that define an inside space for housing a circuit board 30. The lid 24 is configured to close an open top end 26 of the body 22. An inside surface 31 of the lid 24 defines the inside space for housing the circuit board 30.

The lid 24 includes apertures 32 configured to align with apertures 34 in the structure of the body 22. Screws 36 are inserted into the aligned apertures 32, 34 to attach the lid 24 to the body 22. The lid 24 further includes lid apertures 37 (described in further detail below) and an opening 38 configured to allow access to a connector 39.

The body 22 includes a bottom wall 40 and side walls 42, 44, 46, 48. Side wall 42 is configured to allow access to connectors 49.

Referring to FIGS. 1 and 2, the circuit board 30 is mounted in the chassis 20. The circuit board 30 mechanically supports and electrically connects electronic components 50. Exemplary electronic components include chips, central processing units (CPU), other integrated circuits (ICs), and the like. The electronic components 50 are mounted on the circuit board 30 and generate heat during operation of the electronics device 10.

Referring to FIG. 1-6, the communications device 10 further includes a heat transfer assembly 60 that is configured to transfer heat from the electronic components 50 and circuit board 30 to one of the walls 48 of the chassis 20. Hereinafter, the one of the side walls 48 of the chassis 20 is referred to as dissipating side wall 48. The dissipating side wall 48 is selected to dissipate heat due to the configuration of the components in the exemplary chassis 20. In alternative embodiments, another of the walls of the chassis 20 is selected and/or the components of the chassis 20 are alternatively arranged.

The dissipating side wall 48 dissipates heat by radiation to the outside of the chassis 20. In some embodiments, the electronics device 10 includes elements (e.g., fans) that cool the dissipating side wall 48 and facilitate dissipating heat.

Exemplary embodiments described herein include a heat pipe. Generally, a heat pipe is a heat transfer device that combines the principles of thermal conductivity and phase transition to transfer heat between two solid interfaces, a hot interface and a cold interface. For example, a heat pipe includes a liquid that is sometimes in a vapor state. At the hot interface, which is typically at a very low pressure, the liquid is in contact with a thermally conductive solid surface and turns into a vapor by absorbing heat from that surface. At the cold interface, the vapor condenses back into a liquid, releasing the latent heat. The liquid then returns to the hot interface (e.g. through capillary action or gravity action) and the cycle repeats. The internal pressure of the heat pipe can be set or adjusted to facilitate the phase change required for effective heat transfer.

Referring to FIGS. 1 and 2, the heat transfer assembly 60 includes a heat pipe 62, a brace 64, mounting structures 66, and a coupling plate 68. Referring to FIG. 1, the exemplary heat pipe 62 is a slightly flat, elongated structure including a first end 70 and a second end 72. The first end 70 is the hot interface and the second end 72 is the cold interface.

Referring to FIG. 2, the first end 70 is coupled to the electronic components 50 by the coupling plate 68 and the second end 72 is positioned against the dissipating side wall 48 by the brace 64. Particularly, the coupling plate 68 includes apertures 67 configured to receive screws (not shown) to attach the coupling plate 68 to the circuit board 30 over the electronic components 50. The coupling plate further includes a slot 69 configured to receive the first end 70 of the heat pipe 62.

To sufficiently dissipate heat from the second end 72 to the side wall 48, a thermally conducting interface material (referred to as thermal pad 73) is used to remove air gaps between the second end 72 and the side wall 48. The thermal pad 73 can be an electrically isolating material so as not to create a continuous path of current from the sidewall 48 to the coupling plate 68 and thereby protect the electronic components 50 from an external power surge.

Figure 5:
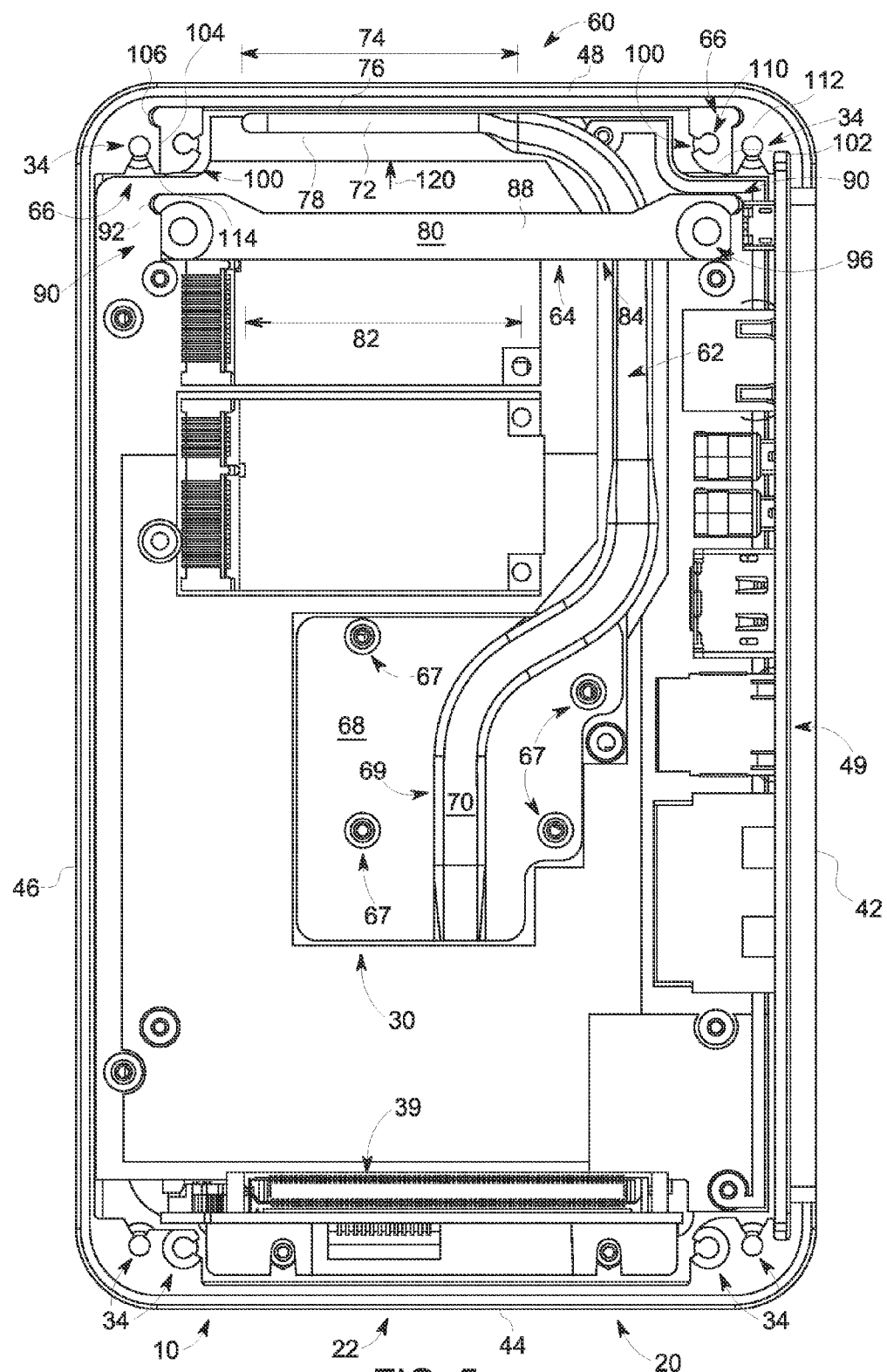
FIG. 5 is an exploded plan view of the electronics device of FIG. 1.
Figure 6:
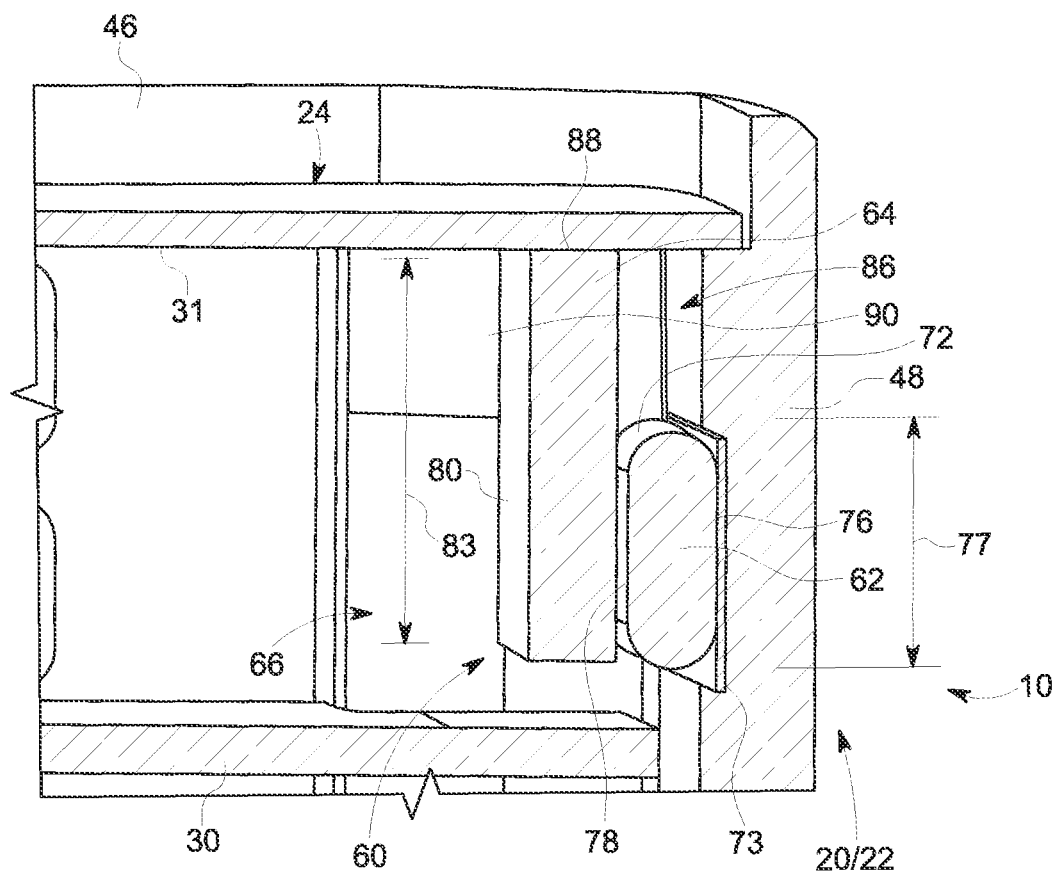
FIG. 6 is a partial elevational cross-sectional view of a heat pipe assembly of the electronics device of FIG. 1.

Referring to FIG. 5, a length 74 of the second end 72 that is in contact with the dissipating side wall 48 is maximized to maximize the heat transfer between the heat pipe 62 and the dissipating side wall 48. Referring to FIG. 6, an inside surface 76 of the second end 72 is in contact with the dissipating side wall 48. The inside surface 76 has a contacting surface area that is approximately the product of the length 74 and a width 77. An outside surface 78 of the second end 72 is opposite the inside surface 76.

Referring to FIGS. 1-6, the brace 64 is configured to apply force to the heat pipe 62 to keep the heat pipe 62 in contact with the dissipating side wall 48. The brace 64 is made of a material with a low thermal coefficient of expansion and is electrically non-conducting. Exemplary materials include high temperature plastics, carbon-fibers, ceramics, and the like. As such, heat is transferred from the heat pipe 62 to the dissipating side wall 48 rather than to the brace 64. In addition, the force applied by the brace 64 does not substantially change as a result of heat from the heat pipe 62. Further, the brace 64 provides a non-conducting barrier between the heat pipe 62 and the electronic components 50 in the chassis 20.

The brace 64 includes a medial portion 80 that is configured to contact the outside surface 78 of the heat pipe 62 (see FIG. 6). Referring to FIG. 5, the medial portion 80 of the brace 64 has a length 82 that is configured to apply force substantially along the length 74 of the heat pipe 62 that is in contact with the dissipating side wall 48. Referring to FIG. 6, the medial portion 80 has a width 83 that is configured to apply force substantially along the width 77 of the heat pipe 62 that is in contact with the dissipating side wall 48. As such, the brace 64 applies over substantially the entire surface area of the heat pipe 62 that is in contact with the dissipating side wall 48. Thus, the brace 64 maintains contact between the heat pipe 62 and the dissipating side wall 48.

Referring to FIGS. 1-3, the medial portion 80 also includes a notch 84 that is configured to allow the heat pipe 62 to enter the area 86 between the brace 64 and the dissipating side wall 48.

Referring to FIG. 6, the brace 64 includes a top surface 88 that is configured to be flush with, in flat face contact with, adjacent to, or in partial or substantial contact with the inside surface of the lid 24.

Referring to FIGS. 2-5, the exemplary brace 64 and chassis 20 are configured such that the brace 64 can be held in place (e.g., press fit into position). The brace 64 includes end portions 90 at opposed ends of the brace 64. Each end portion 90 includes a protrusion 92. Each protrusion 92 is offset from the plane surface of the medial portion 80 that is configured to contact the outside surface 78 of the heat pipe 62. Particularly, each protrusion 92 is offset towards the dissipating side wall 48 when the brace 64 is held in place in the chassis 20.

The protrusions 92 protrude outwardly along the longitudinal dimension of the brace 64. For example, the protrusions 92 protrude towards side walls 42, 46 when the brace 64 is held in place in the chassis 20.

The brace 64 and chassis 20 are further configured to secure the brace 64 to the chassis 20. Each end portion 90 includes a brace aperture 96 that is configured to receive a screw 98 to mount the brace 64 to the mounting structures 66. The axis of the brace aperture 96 is parallel to the plane surface of the medial portion 80 that is configured to contact the outside surface 78 of the heat pipe 62 and to the plane of the dissipating side wall 48. As such, when the brace 64 is held in place by the mounting structures 66, screws 98 are easily dropped into the brace apertures 96 and tightened towards the bottom wall 40 of the chassis 20 to secure the brace to the chassis 20.

Each mounting structure 66 includes a cutout 100 that is configured to receive one of the end portions 90 of the brace 64. Each cutout 100 includes a bottom surface 102 and a side surface 104. Each side surface 104 includes a depression 106 that is configured to receive a respective protrusion 92. In the exemplary embodiment, the protrusions 92 and depressions 106 have convex and concave shapes, respectively. The protrusions and depressions are complimentary or mate with one another.

The shape and dimension of the exemplary protrusions 92 and depressions 106 are configured such that the brace 64 can be held in place (e.g., press fit) as described in further detail below. In some embodiments, the protrusions 92 and depressions 106 have other shapes and dimensions. For example, referring to FIG. 2, the brace 64 is dropped into place by moving the brace 64 towards the bottom wall 40 from above the heat pipe 62.

A chassis aperture 110 is formed in each mounting structure 66 through a respective bottom surface 102. The chassis apertures 110 are configured to align with the brace apertures 96 when the protrusions 92 are received in the depressions 106 (e.g., when the brace 64 is positioned to force the heat pipe 62 against the dissipating side wall 48). Further, the lid apertures 37 are configured to align with the brace apertures 96 and the chassis apertures 110 when the lid 24 is positioned on the body 22 to close the open top end 26. When the brace 64 is held in place and the lid 24 is positioned on the body 22, screws 98 can be inserted into aligned apertures 37, 96, 110 to secure the brace 64 to the mounting structures 66 and the lid 24 to the body 22.

Each mounting structure 66 also includes an inside surface 112 and a top surface 114. Apertures 34 described above are formed in the top surface 114.

Figure 7:
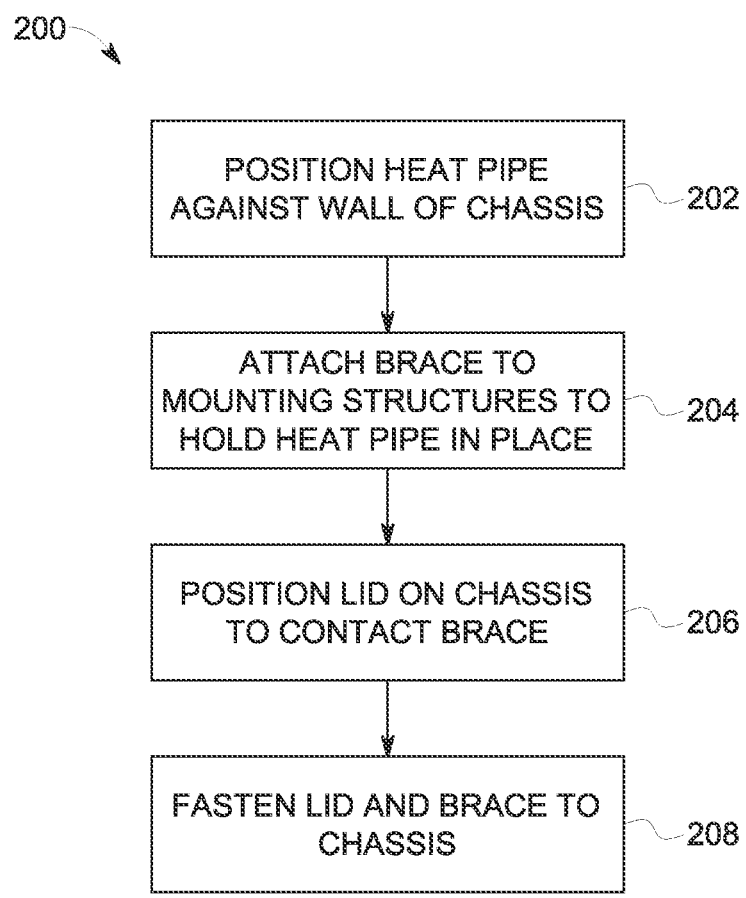
FIG. 7 is a flow chart of an exemplary method of assembling the heat transfer assembly of FIG. 1.

Referring to FIG. 7, an exemplary method 200 of assembling the heat transfer assembly 60 is now described in further detail. According to a heat pipe positioning step 202, referring to FIGS. 1 and 4, the second end 72 of the heat pipe 62 is positioned along the dissipating side wall 48 with the thermal pad 73 therebetween. According to a brace attaching step 204, referring to FIG. 2, the brace 64 is dropped into place by moving the brace 64 towards the bottom wall 40 from above the heat pipe 62. During this step 204, the protrusions 90 are received in the depressions 106 and the medial portion 80 contacts the heat pipe 62. Thereby, the brace 64 is held in place in the mounting structures 66.

Once the protrusions 92 are received in the depressions 106, the brace apertures 96 are substantially aligned with the chassis apertures 110 and the medial portion 80 applies a force to the heat pipe 62 to keep the heat pipe 62 in place. According to a lid positioning step 206, to further connect the brace 64 and the mounting structures 66 and maintain or increase the force of the brace 64 on the heat pipe 62, the lid 24 is positioned to cover the top opening 26 (e.g., provide a top wall). Referring to FIG. 6, the inside surface 31 of the lid 24 is in contact with the top surface 88 of the brace 64, which further secures the brace 64 in place and reinforces the contact between the brace 64 and the heat pipe 62. According to a fastening step 208, screws 98 are inserted through the aligned apertures 37, 96, 110 and tightened to secure the lid 24, brace 64, and mounting structures 66 as a unit.

This exemplary arrangement is simple since screws 98 can be dropped into aligned apertures 37, 96, 110. However, in alternative embodiments, the axes of the brace apertures 96 and chassis apertures 110 are configured to be perpendicular to the dissipating side wall 48 or any other angle with respect to the dissipating side wall 48. Here, the screws may be tightened to bring the brace 64 into contact with the heat pipe 62.

In some embodiments, the brace 64 is alternatively positioned in the mounting structures 66. According to an alternative brace attaching step 204, referring to FIG. 4, the brace 64 is positioned in the chassis 20 at a distance out from the mounting structures 66 and dissipating side wall 48. Referring to a directional arrow 120, the brace 64 is translated towards the dissipating side wall 48 until the end portions 90 contact the mounting structures 66.

Particularly, each protrusion 90 contacts the inside surface 114 of one of the respective mounting structures 66. Force is applied to continue to move the brace 64 towards the dissipating side wall 48. The brace 64 is able to move past the inside surfaces 114 of the mounting structures 66 due to flexing of the brace 64 and the rounded shape of the protrusions 92. The flexed brace 64 forces the protrusions 92 against respective side surfaces 104 until the end portions 90 reach the dissipating side wall 48.

Once the end portions 90 reach the dissipating side wall 48, the protrusions 92 are received in the depressions 106 and the brace 64 unflexes. The unflexing action forces the protrusions 92 into the depressions 106 to hold the brace 64 in place. Thereby, the brace 64 is held in place by the mounting structures 66 and the brace 64 keeps the heat pipe 62 in place.

As used herein, terms such as top, bottom, side and the like do not limit the orientation of the elements of the exemplary embodiments. Rather, such terms are used to distinguish such elements from one another.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims or if they include equivalent structural elements with insubstantial differences from the literal language of the claims.

The invention claimed is:

1. An electronics device, comprising:
   a circuit board,
   a chassis that houses the circuit board,
   a heat pipe configured to transfer heat from the circuit board to a wall of the chassis, and
   a brace configured to press the heat pipe against the wall and comprising a top surface; and
   a lid configured to provide a wall of the chassis, wherein the lid is configured to contact the top surface of the brace when the brace is held in place by the mounting structure.

2. The electronics device of claim 1, further comprising a coupling plate configured to couple a first end of the heat pipe to the circuit board.

3. The electronics device of claim 1, further comprising a thermal pad configured to couple a second end of the heat pipe to the wall.

4. The electronics device of claim 1, a length of the heat pipe that is in contact with the wall comprising a flattened cross-section.

5. The electronics device of claim 1, wherein the brace has a low thermal coefficient of expansion.

6. The electronics device of claim 1, wherein the brace is electrically non-conducting.

7. The electronics device of claim 1, the brace comprising a medial portion that is configured to contact the heat pipe, the medial portion comprising a notch that is configured to allow the heat pipe to enter an area between the brace and the wall.

8. The electronics device of claim 1, the brace comprising a medial portion that is configured to contact the heat pipe, wherein the medial portion has a length that is substantially equal to or greater than a length of the heat pipe that is in contact with the wall.

9. An electronics device, comprising:
  a circuit board,
  a chassis that houses the circuit board and comprising at least one mounting structure,
  a heat pipe configured to transfer heat from the circuit board to a wall of the chassis, and
  a brace configured to press the heat pipe against the wall and comprising a medial portion that is configured to contact the heat pipe and at least one end portion that is configured to be held in place by the mounting structure, and
  the end portion comprising a protrusion and the mounting structure including a depression, wherein the depression is configured to receive the protrusion.

10. The electronics device of claim 9, wherein the at least one mounting structure includes two mounting structures and the at least one end portion includes two end portions.

11. The electronics device of claim 9, the end portion comprising a brace aperture.

12. The electronics device of claim 11, the mounting structure comprising a chassis aperture configured to align with the brace aperture.

13. The electronics device of claim 12, further comprising a lid configured to provide a wall of the chassis, the lid comprising at least one lid aperture, wherein the lid aperture is configured to align with the brace aperture and the chassis aperture.

14. The electronics device of claim 11, wherein the axis of the brace aperture is substantially parallel to the plane of the wall.

15. A brace configured to press a heat pipe against a wall of a chassis, comprising:
  a medial portion configured to contact a heat pipe; and
  at least one end portion comprising a protrusion that is configured to be received in a depression of a chassis.

16. The brace of claim 15, wherein the medial portion comprises a notch that is configured to allow a heat pipe to enter an area between the brace and a wall.

17. The brace of claim 15, wherein the end portion comprises a brace aperture that is configured to align with a chassis aperture when the protrusion is received in a depression of a chassis.

18. The brace of claim 15, further comprising a top surface that is configured to contact an inside surface of a lid.

* * * * *